United States Patent [19]

Balakrishnan et al.

[11] Patent Number: 5,574,734
[45] Date of Patent: Nov. 12, 1996

[54] TEST GENERATION OF SEQUENTIAL CIRCUITS USING SOFTWARE TRANSFORMATIONS

[75] Inventors: Arun Balakrishnan, Piscataway; Srimat T. Chakradhar, North Brunswick, both of N.J.

[73] Assignee: NEC USA, Inc., Princeton, N.J.

[21] Appl. No.: 539,392

[22] Filed: Oct. 5, 1995

[51] Int. Cl.$^6$ .................................................. G01R 31/28
[52] U.S. Cl. ............................................ 371/27; 371/22.1
[58] Field of Search ............... 371/27, 22.1; 324/158 R, 324/73.1, 537; 364/578

[56] References Cited

U.S. PATENT DOCUMENTS

| | | | |
|---|---|---|---|
| 4,901,259 | 1/1990 | Watkins | 364/578 |
| 4,922,445 | 5/1990 | Mizoue et al. | 364/578 |
| 4,967,386 | 10/1990 | Maeda et al. | 364/578 |
| 4,991,176 | 2/1991 | Dahbura et al. | 371/27 |
| 5,004,978 | 4/1991 | Morris, Jr. et al. | 324/158 R |
| 5,291,495 | 3/1994 | Udell, Jr. | 371/22.3 |
| 5,479,414 | 12/1995 | Keller et al. | 371/22.3 |

OTHER PUBLICATIONS

Chang, "An Alorithm for Selecting an Optimum Set of Diagnostic Tests", IEEE Transactions on Electronic Computers, vol. EC-14, No. 5, pp. 706-711.

Yau et al., "Multiple Fault Detection for Combinational Logic Circuits", IEEE Transactions on Computers, vol. C-24, No. 3, Mar. 1975, pp. 233-242.

C. E. Leiserson and J. B. Saxe, "Retiming Synchronous Circuitry," in Algorithmica, vol. 6, pp. 5-35, 1991.

*Primary Examiner*—Hoa T. Nguyen
*Attorney, Agent, or Firm*—Arthur J. Torsiglieri

[57] ABSTRACT

A process for generating a test set for a sequential integrated circuit that includes performing a transformation on a software model of the circuit to provide a modified software model that should be more easily tested but that need not be functionally equivalent, and deriving a test set for the modified software model in conventional fashion. Thereafter, the derived test set is inverse mapped to derive a test set for the original sequential circuit. The transformation used essentially involves (1) the borrowing and/or returning registers at the primary inputs and/or primary outputs and (2) positioning the registers in the modified model as needed.

6 Claims, 4 Drawing Sheets

| Sequence Length | Number of Sequences |
|---|---|
| 1 | 1 |
| 2 | 1 |
| 3 | 5 |
| 4 | 1 |

FIG. 2

| Sequence Length | Number of Sequences |
|---|---|
| 1 | 1 |
| 2 | 4 |
| 3 | 2 |
| 4 | 0 |

FIG. 4

TEST GENERATION OF SEQUENTIAL CIRCUITS USING SOFTWARE TRANSFORMATIONS

FIELD OF THE INVENTION

This invention relates to the testing of integrated circuits and more particularly to the generation of test sets for high-performance sequential circuits. A sequential circuit, as the term is used herein, is a circuit that includes one or more memory elements, such as flip-flops or registers, whose presence makes the signals at the primary output of the circuit dependent not only on the current signals at the primary inputs but also on earlier input signals that influenced the current state of the memory elements of the circuit.

BACKGROUND OF THE INVENTION

Because testing of large integrated circuits generally cannot include taking measurements at internal nodes of the circuit, testing is generally done by applying to the primary inputs of the circuit a test vector, which is a set of logic values designed to test for a particular fault, and observing the resulting logic values at the primary output of the circuit to decide whether the circuit is free of the fault. For testing high-performance sequential circuits, testing for most if not all possible faults may require that a long sequence of test vectors (a test set) be applied to the primary inputs, and in some instances that the sequence be repeated. The size of a test sequence is the number of test vectors in the sequence and the size of a test set is the number of vectors in all its required test sequences. Generally, the generation of a full test set can be a formidable task.

The need for testing has become an important factor in the design of high-performance integrated circuits. It is generally impractical to incorporate integrated circuits that have not been tested into complex systems that require a number of integrated circuits, all operating successfully, and to run the risk of failure of the system in the field because of one defective integrated circuit.

One solution for rendering high-performance sequential designs to be more easily testable has been to introduce hardware modifications, such as synthesis or design for testability. After these modifications, state of the art sequential test generators can be used to obtain tests that provide high fault coverage. However, these modifications typically entail area and performance penalties and this may conflict with the area and performance constraints of the design.

Additionally, recent work has shown that retiming transformations that are known to preserve functionality, also preserve testability with respect to a single stuck-at fault test set. Therefore, another approach to testing retimed circuits can be to generate a test set for the original design and use this test set for the retimed circuit.

SUMMARY OF THE PRESENT INVENTION

The present invention describes a new approach, called Software (model) Transformations and Generation of Stimulus (STAGS), for generating high fault coverage tests for high-performance designs of sequential circuits. Unlike hardware transformations, this approach does not modify the design to facilitate testing. Instead, it transforms a software model of the design into a new software model that need not be functionally equivalent to the original design but does have desirable testability properties not satisfied by the original design. Basically, the transformation involves borrowing or returning registers at the primary inputs and/or primary outputs and positioning them as needed in the circuit to minimize particular testability metrics, such as number of registers or length of test sequences, such that the generation of test sets is facilitated. Test sets are then generated for the new model using standard techniques and these test sets are then inverse mapped to serve as tests for the original design. Accordingly, in this way, we solve the test generation problem for the original design. The invention can be characterized as involving software transformations for testability.

This new approach has several characteristics. No hardware modifications need to be made in the original design and the new software model that is better adapted for testing need not be functionally equivalent to the original design, although it does preserve testability. The new model is derived by targeting several testability properties, such as fewer registers or shorter sequences, that need not be considered or incorporated during synthesis of the original design. Our transformation guarantees that tests generated for the new model can always be inverse mapped to serve as tests for the original hardware design. The results we have obtained provide evidence that it is not always necessary to tradeoff performance for testability during synthesis of high performance designs.

STAGS advantageously involves two operations to be termed STAGS I and STAGS II. The first operation STAGS I modifies the software model of the original design to a new software design that has fewer registers or flip-flops than the functionally equivalent design obtainable by retiming. STAGS II further modifies the software model resulting from STAGS I to a model that will result in a reduced test sequence length. Various other transformations can be derived using the STAGS methodology, if needed.

Essentially, both STAGS I and STAGS II involve borrowing or returning registers from the primary inputs and outputs, without regard to maintaining the functionality of the circuit, and repositioning them as needed.

Once the transformed software model has been obtained, conventional automatic test generation techniques can be utilized to obtain a test set for the transformed software model. The test set so obtained is then inverse mapped to obtain a test set that can be used for the original sequential integrated circuit. The inverse-mapping aims to nullify the effect of the borrowing, returning, and repositioning of the registers that characterized the STAGS operations, and may restore the length of the test sets needed for testing the original circuit. The principal saving is in the time and effort needed to generate the test sets that are used in the actual testing.

The invention will be better understood from the following more detailed description taken in conjunction with the accompanying drawing.

BRIEF DESCRIPTION OF THE DRAWING

FIG. 2 is the profile of a test set for the circuit shown in FIG. 1 obtained by conventional automatic test generation.

FIG. 4 is the profile for the test set for the circuit shown in FIG. 3.

DETAILED DESCRIPTION OF THE INVENTION

Figure 1:
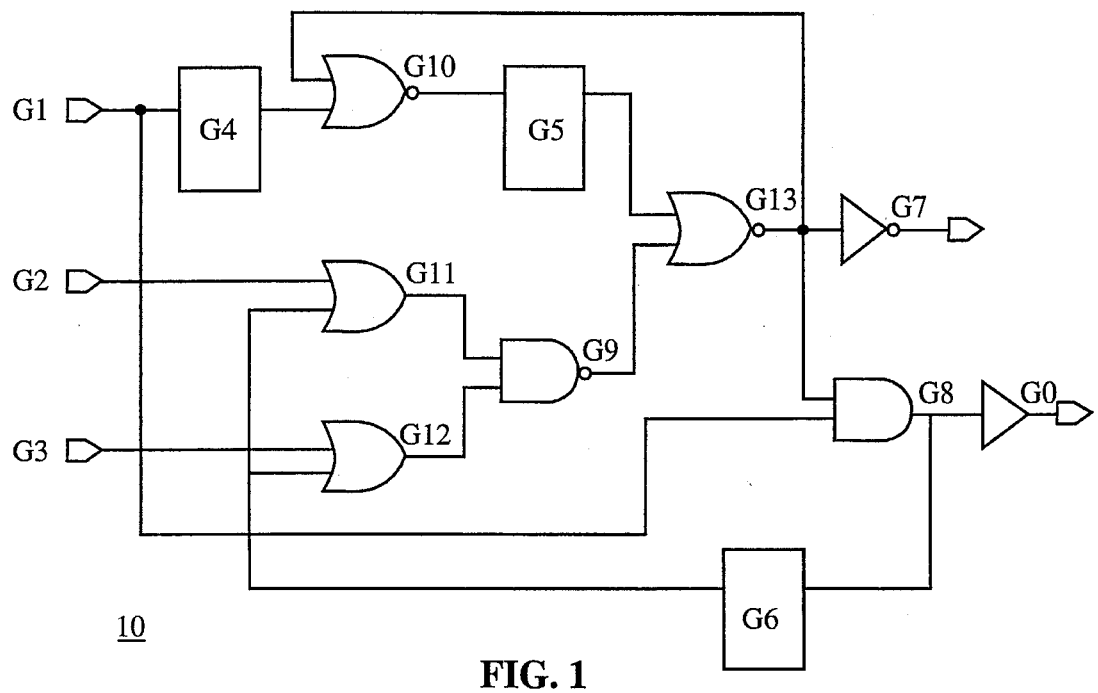
FIG. 1 shows the logic design of a sequential circuit for which there is to be generated a test set by the process of the invention.

It will be helpful to preface a detailed description of the present invention with a general discussion of the problem of test generation for complex sequential circuits.

Sequential test generation for a stuck-at fault model is a well known hard problem. The task of generating a test for a designated fault in a sequential circuit usually consists of three steps: state initialization, fault excitation or activation, and fault propagation or state differentiation. Further, generating a sequence of vectors may be necessary for each of these steps. The search space for finding each vector is exponential in the number of flip-flops and primary inputs of the circuit.

The STAGS approach to solving the test generation problem for high-performance designs relies on software transformations that improve the testability of a design. These transformations are applied to a software model of a design that has previously been optimized for performance. These transformations result in a new software model that may not be functionally equivalent to the original design. Tests are generated for the new model instead of the original design and then inverse mapped to serve as tests for the original design.

Before discussing the specific software transformations termed STAGS I and STAGS II, which are the more important components of the STAGS process that form the present invention, we will discuss software transformations more broadly.

A software transformation is specified as an integer function $\mathcal{T}$ on the vertices of the circuit graph. Like the retiming formulation, this function also associates an integer with every vertex of the circuit graph. The interpretation of the integer value of a vertex is similar to the retiming formulation. However, there is one significant difference. Unlike the retiming formulation, primary inputs and primary outputs are allowed to borrow (return) registers or flip-flops from (to) the environment. This may no longer preserve the functionality of the original design. If the integer k associated with a primary input vertex is positive (negative), then k flip-flops are returned to (borrowed from) the environment. Similarly, if the integer k associated with a primary output is positive (negative), then k flip-flops are borrowed from (returned to) the environment. Software transformations impose no restriction on the borrowing or returning of flip-flops from/to the environment. We refer to this as arbitrary borrowing and returning of flip-flops.

Definition: An integer function $\mathcal{T}$ is a STAGS transformation if and only if it satisfies the following conditions:

C0: If the values assigned to primary input vertices $g_i$, $i \in I$ and primary output vertices $g_j$, $j \in O$ are not all the same then they must satisfy:

$$\sum_{i \in I} c_i \cdot \mathcal{T}(g_i) - \sum_{j \in O} d_j \cdot \mathcal{T}(g_j) \neq 0$$

Here, $c_i$ is the number of primary outputs a primary input $g_i$, $i \in I$ can reach and likewise, $d_j$ is the number of primary inputs that can reach a primary output $g_j$, $j \in O$.

C1: For every arc $e=g_i \rightarrow g_j$ the transformed arc weight $w_{\mathcal{T}}(e)=w(e)+\mathcal{T}(g_j)-\mathcal{T}(g_i)$ must be non-negative.

Given a sequential circuit C and a circuit C$\mathcal{T}$ that is obtained using the STAGS transformation $\mathcal{T}$ on circuit C, we will say that C$\mathcal{T}$ is a STAGS transformation of circuit C. Also, we will refer to circuits obtained using STAGS transformations as STAGS models. The importance of STAGS transformations is captured in Theorem 1. As shown by the theorem, all these transformations preserve testability.

A trivial example of a STAGS transformation is the case when all vertices in the circuit graph are assigned the same value k. Clearly, condition C1 is satisfied for all arcs in the circuit graph. This is because the transformed arc weight is the same as the arc weight before the transformation. Furthermore, condition C0 is also trivially satisfied. This transformation does not modify the circuit. A more interesting STAGS transformation $\mathcal{T}_R$ is the following: this transformation assigns the same integer value to all the primary input and primary output vertices. Again, this also satisfies condition C0 trvially. Furthermore, if the transformation satisfies condition C1, then $\mathcal{T}_R$ is nothing but the familiar retiming transformation. This shows that retiming is a special case of STAGS transformations. An interesting variant of retiming, called peripheral retiming, has been proposed for sequential logic optimization of a sub-class of pipelined circuits (circuits that have no feedback loops) that also satisfy certain other conditions. It can be shown that peripheral retiming is also a special case of STAGS transformations.

The invention uses particular STAGS transformations to obtain testable models of high-performance designs. Conditions C1 and C0 provide the framework for the design of STAGS transformations. A wide range of STAGS transformations are possible for any given circuit in this framework. As shown above, these transformations produce circuits that are not obtainable using known techniques like retiming. Not all STAGS transformations are useful from a testability point of view. For example, high performance designs obtained using retiming are often very hard to test. However, there are several STAGS transformations that are extremely useful from a test generation point of view. The two, termed STAGS I and STAGS II, form the basis for the present invention.

Figure 3:
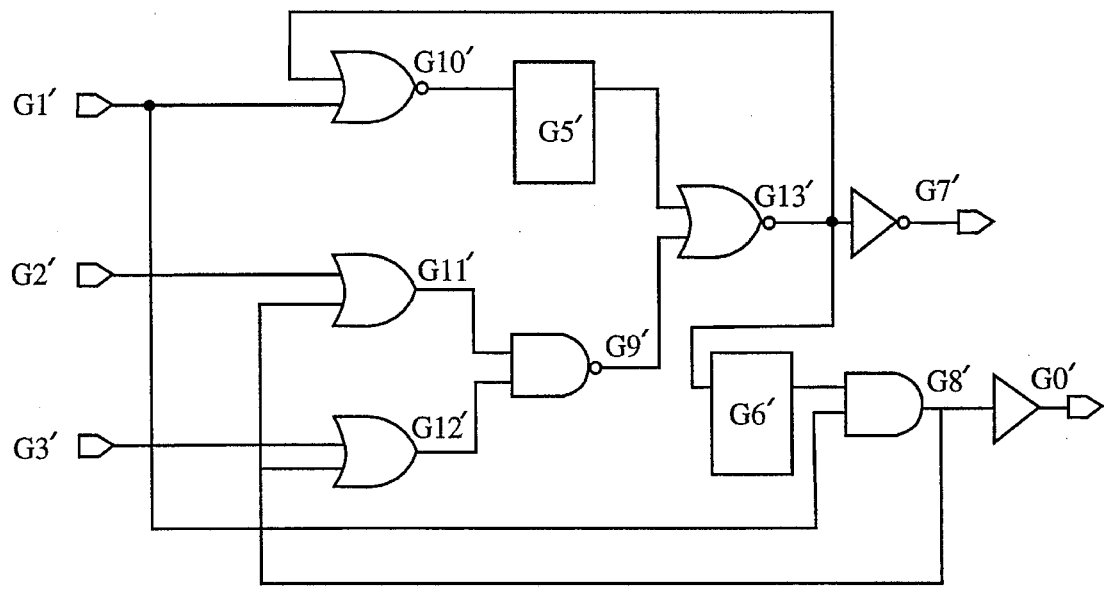
FIG. 3 is the STAGS model for the circuit shown in FIG. 1.

The first transformation, STAGS I, seeks to develop a software model that has essentially fewer flip-flops than the original design. Reducing the number of flip-flops reduces the search space of the sequential test generation problem. The STAGS I transformation is significantly different than minimizing the number of flip-flops in a design. For example, consider the circuit of FIG. 1 described more fully later. This circuit has three flip-flops. Conventional techniques for minimizing flip-flops will not be able to reduce the number of flip-flops any further. However, the STAGS I transformation results in the circuit shown in FIG. 3, also to be discussed more fully later, that has only two flip-flops. The STAGS I transformation differs from conventional flip-flop minimization techniques in the following way. Unlike conventional techniques, STAGS I transformation may produce a circuit that is not functionally equivalent to the original design. For example, the circuits shown in FIGS. 1 and 3 are not functionally equivalent. Since STAGS I considers both circuits that may or may not be functionally equivalent to the original design, it is able to minimize the number of flip-flops beyond what is possible using conventional techniques.

The second software transformation, STAGS II, is aimed at reducing the length of the test sequences that have to be computed. Hence, STAGS II, yields a software model that has shorter test sequences as compared to the original design. Since test set length can have an impact on the test generation effort required, a STAGS II transformation also can result in a software model that requires less test generation effort. Again, this transformation also need not preserve functionality. It may produce a software model that is not functionally equivalent to the original design. However, it can be established that the test sequences derived for the new model by STAGS II can always be inverse mapped to give test sequences for the original circuit.

It can be appreciated that the two transformations are independent and either one or both can be used in any particular case.

We will describe polynomial time algorithms for both transformations, STAGS I and STAGS II. We formulate these two transformations as minimum cost network flow problems on the circuit graph such as the one shown in FIG. 5. Experimental results show that these transformations are applicable to large designs.

The invention will now be described with particular reference to the sequential circuit 10 shown in FIG. 1. This circuit has three primary inputs G1, G2 and G3 and two primary outputs G0 and G7.

The primary input G1 supplies the flip flop G4 that in turn supplies one input to NOR gate G10. Input G1 also supplies an input to the AND gate G8. The primary input G2 supplies one input to OR gate G11 whose other input is supplied by the output of flip flop G6. The primary input G3 supplies the OR gate G12 whose other input is supplied by the output of flip flop G6. The output of NOR gate G10 is supplied to the flip-flop G5 which supplies an input to NOR gate G13 whose output supplies the other input to NOR gate G10. The output of OR gate G11 is supplied to NAND gate G9 which supplies the other input to NOR gate G13. The output of OR gate G12 supplies the other output to NAND gate G9. The output of NOR gate G13 is also applied as an input to inverter gate G7, AND gate G8 and inverter gate G7 which also serves as a primary output. The output of AND gate G8 is applied both to the flip-flop G6 and as an input to the buffer gate G0 that serves as a primary output.

For purposes of analysis, the circuit 10 is viewed as an interconnection of combinational logic gates and registers (flip-flops). Let $g_1, \ldots, g_n$ be the set of primary inputs, primary outputs and logic gates in the sequential circuit. We represent the circuit by a directed graph, called the circuit graph, that has a vertex for every primary input, primary output and logic gate $g_i$, $1 \leq i \leq n$. However, there are no vertices in the circuit graph that correspond to the registers or flip-flops of the circuit. There is an arc from vertex $g_i$ to vertex $g_j$ if the gate or primary input $g_i$ drives the gate $g_j$. A gate or primary input $g_i$ can drive another gate $g_j$ directly or through some registers. This is indicated by assigning a weight on the arcs of the circuit graph, equal to the number of registers, if any, between the corresponding gates.

Figure 5:
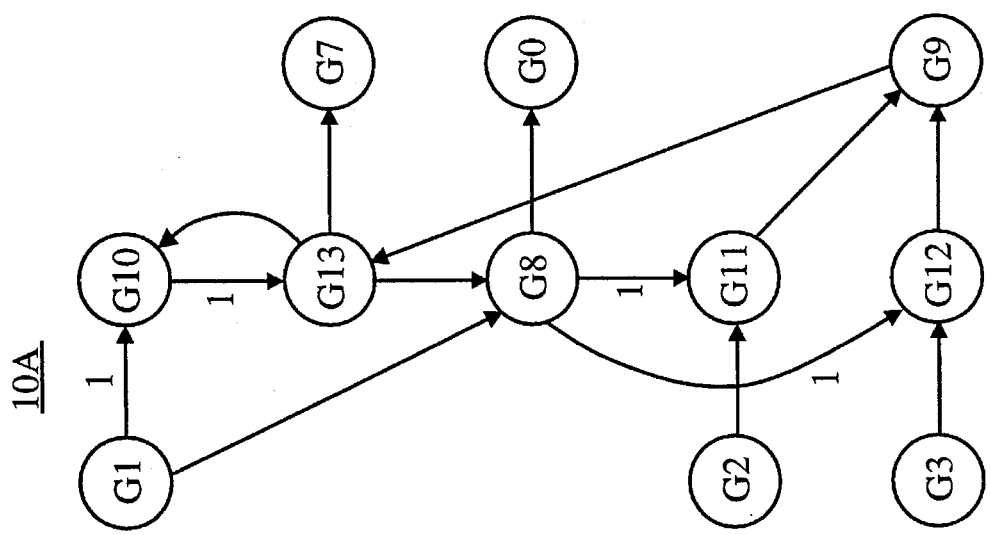
FIG. 5 is the circuit graph of the circuit shown in FIG. 1.

The circuit 10 shown in FIG. 1 has its circuit graph 10A shown in FIG. 5. The circuit 10 has a flip-flop between signal G8 and G12. Therefore, in circuit graph 10A, the arc from vertex G8 to vertex G12 has a weight of 1.

FIG. 2 is a profile of the test set for the possible faults in circuit 10. This test set has twenty-two vectors.

The STAGS model for circuit 10 of FIG. 1 is shown as the circuit 20 of FIG. 3. How it is derived will be discussed later. The circuit 20 has primary inputs G1', G2', G3' and primary outputs G0' and G7'. Primary input G1' supplies inputs to NOR gate G10' and to AND gate G8'. Primary input G2' supplies an input to OR gate G11' and primary input G3' supplies an input to OR gate G12'. AND gate G8' supplies the other input to each of OR gates G11' and G12'. The output of NOR gate G10' is supplied to flip-flop G5' whose output is supplied to NOR gate G13'. The outputs of OR gate G11' and OR gate G12' are the two inputs of NAND gate G9' which supplies the other input to NOR gate G13'. The latter supplies its output as an input to NOR gate G10' and to the inverter G7' which serves as the primary output G7'. The output of NOR gate G13' is also applied to flip-flop G6' which supplies the other input to AND gate G8'. The output of AND gate G8' also serves as the input to buffer G0' that provides the primary output. The profile of the test set for circuit 20 is shown as FIG. 4 and the test set has only 15 vectors. This is about two thirds the number of vectors required for the original circuit, representing a significant reeduction in time to develop the test.

We can now describe how the transformation is performed.

For any given circuit the conditions C0 & C1 can be specified as a set of linear inequalities. We will refer to these inequalities as the transformation inequalities. Then linear programming methods can be used to identify STAGS transformations. This can be done by constructing objective functions that target specific testability properties and then computing an optimal solution for the objective function that satisfies the transformation inequalities. If condition C0 is satisfied implicitly then this formulation can be solved using network flow algorithms. This is because the transformation inequalities will then satisfy the totally unimodular property. This is particularly useful since efficient methods are available for solving network flow problems. Two such objective functions are described below and these form the bases for STAGS I and STAGS II. This allows the use of our particular STAGS transformations for large sequential circuits.

The STAGS I transformation uses a number of flip flops as a testability metric. The search space explored by a sequential test generator is at least exponential in the number of flip-flops and primary inputs of the circuit under test. The objective of the transformation STAGS I is to obtain a STAGS model that has as few flip-flops as possible. Since STAGS I has the flexibility of exploring models that are not functionally equivalent to the original design: it generally produces a STAGS model that has fewer flip-flops than any other functionally equivalent design obtainable by retiming.

The objective function for the transformation STAGS I is constructed as follows. The number of flip-flops on any arc $e$ in the transformed circuit graph is given by $w\mathcal{T}(e) = w(e) + \mathcal{T}(g_j) - \mathcal{T}(g_i)$. Hence, the total number of flip-flops in the transformed circuit graph is given by the summation of the arc weights on all arcs: $\Sigma_{e \in A} w\mathcal{T}(e)$. Here, A is the set of arcs in the circuit graph. For circuits with fanout, the above objective function does not give the correct number of flip-flops in the transformed circuit graph. This is because if a signal g has a fanout to several flip-flops, then one can replace these flip-flops by a new flip-flop that is driven by signal g and the fanout now occurs at the output of the new flip-flop. Proper modeling of fanout in the context of minimizing flip-flops under retiming has been considered before in an article by C.E. Leiserson and J.B. Saxe entitled "Retiming Synchronous Circuitry," in Algorithmica, vol. 6, pp. 5–35, 1991. The circuit graph is modified by adding additional vertices and arcs to account for flip-flop sharing at fanouts. A detailed description of this technique can be found in Leiserson et al, supra. We use a similar technique to accurately model the number of flip-flops in circuits with fanouts. Let $W\mathcal{T}$ be the objective function for the STAGS I transformation. Therefore the formulation for the STAGS I transformation is given as follows:

| | | |
|---|---|---|
| Minimize | $w\mathcal{T}$ | |
| Subject to: | $\mathcal{T}(g_j) - \mathcal{T}(g_i) \geq -w(e)$ | $\forall \; (g_i \to g_j) \in A$ |
| | where $\mathcal{T}(g_i)$ is integral. | |

Here, condition C0 is implicitly satisfied because any assignment of values to the vertices of the circuit graph that does not satisfy the condition C0 will not contribute anything to this objective function.

We now illustrate the STAGS I transformation by an example. Consider the circuit shown in FIG. 1. The circuit graph for this example is shown in FIG. 5. A conventional retiming approach that minimizes the number of flip-flops cannot further decrease the number of flip-flops in this circuit.

The mechanics of STAGS I transformation can be visualized on the circuit of FIG. 1 as follows;

1. Initially, all vertices are assigned the value 0.
2. We borrow one register from the environment to put at the output vertex G0. So $\mathcal{T}(G0)=1$.
3. We move the register G6 and the borrowed register at the fanouts of the vertex G8 to its fanins. Therefore, $\mathcal{T}(G8)=1$.
4. Finally, we remove the registers at the fanouts of the input G1 and return them to the environment and obtain the STAGS model shown in FIG. 5. Therefore, $\mathcal{T}(G1)=1$.

The $\mathcal{T}$ values computed for this transformation satisfies both the conditions C0 and C1. Hence, this is a true STAGS transformation. Note that we borrowed a flip-flop at G8 from the environment but we did not return it back to environment. Similarly, we returned a register at G1 to the environment without having borrowed any at that primary input. This is referred to as arbitrary borrowing and returning of flip-flops. Hence, the functionality of the circuit is not preserved. However, as we show later, the test sequences computed for the STAGS model of FIG. 3 can be inverse mapped to obtain test patterns for the original circuit.

Figure 6:
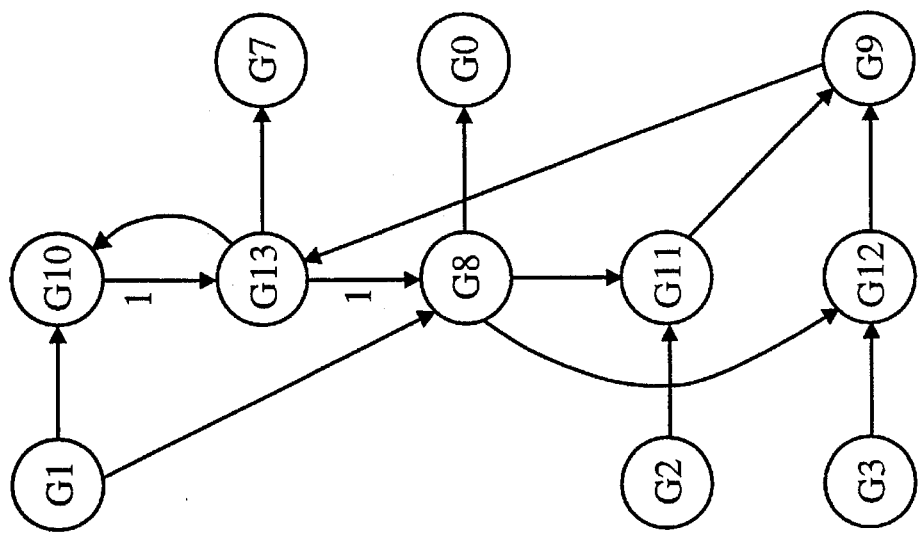
FIG. 6 is the circuit graph of the transformed circuit shown in FIG. 3, after the STAGS operations.

The mathematical formulation of STAGS I for this example is as follows. We use the circuit graph shown in FIG. 3. Note that circuit graph of the STAGS model shown in FIG. 6 is similar to the circuit graph of the original design shown in FIG. 5. The only difference between the two graphs is the assignment of weights to the arcs. Therefore, the STAGS transformations maintain a one-to-one correspondence between faults in the original circuit and faults in the STAGS model. A test set obtained by inverse mapping the test sequences of the STAGS model provides the same fault coverage and fault efficiency for the original design as that obtained for the STAGS model.

The objective function is the sum of the transformed arc weights $w\mathcal{T}(e)$ for all arcs in the circuit graph. The transformation inequalities that correspond to condition C1 are as follows:

| | | |
|---|---|---|
| $\mathcal{T}(G10) - \mathcal{T}(G1) \geq -1$ | $\mathcal{T}(G11) - \mathcal{T}(G2) \geq 0$ | $\mathcal{T}(G8) - \mathcal{T}(G13) \geq 0$ |
| $\mathcal{T}(G8) - \mathcal{T}(G1) \geq 0$ | $\mathcal{T}(G12) - \mathcal{T}(G3) \geq 0$ | $\mathcal{T}(G0) - \mathcal{T}(G8) \geq 0$ |
| $\mathcal{T}(G13) - \mathcal{T}(G10) \geq -1$ | $\mathcal{T}(G9) - \mathcal{T}(G11) \geq 0$ | $\mathcal{T}(G11) - \mathcal{T}(G8) \geq -1$ |
| $\mathcal{T}(G10) - \mathcal{T}(G13) \geq 0$ | $\mathcal{T}(G9) - \mathcal{T}(G12) \geq 0$ | $\mathcal{T}(G12) - \mathcal{T}(G8) \geq -1$ |
| $\mathcal{T}(G7) - \mathcal{T}(G13) \geq 0$ | $\mathcal{T}(G13) - \mathcal{T}(G9) \geq 0$ | |

We minimize the objective function subject to the transformation inequalities given above using a minimum cost flow algorithm. Since the transformation inequalities have a special structure the dual of this linear programming problem can then be solved as a minimum cost flow problem. One optimum solution for this example is as follows: $\mathcal{T}(G0)=\mathcal{T}(G8)=\mathcal{T}(G1)=1$, with all the other $\mathcal{T}()$ values equal to zero. The transformed circuit graph corresponding to this optimum solution is shown in FIG. 6 and the corresponding STAGS circuit model is shown in FIG. 3.

The STAGS II transformation uses test sequence length as a testability metric. Longer test sequences typically require more test generation effort. This is because the length of a test sequence directly corresponds to the number of time frames a test generator has to consider for generating the test. To reduce the test sequence length, STAGS II transformation returns as many flip-flops as possible to the environment, from the primary input and primary output vertices. Formulation of STAGS II transformation as a network flow problem is non-trivial. One possible objective function can be constructed as follows. The number of flip-flops returned to the environment by the primary input vertices is given by the summation of the values assigned to these vertices. Similarly, the number of flip-flops returned to the environment by the primary output vertices is given by the negative of the summation of the values assigned to these vertices. Note that if k is a positive quantity, then flip-flops have been borrowed from the environment. The objective function that simultaneously maximizes the summation of values assigned to primary inputs and minimizes the summation of the values assigned to primary outputs might seem to be an obvious choice. However, optimizing this objective function under conditions C0 and C1 is difficult.

It is possible to re-formulate STAGS II transformation as a network flow problem by constructing an objective function whose optimization will implicitly ensure that condition C0 is satisfied. An objective function that achieves this goal consists of primary and secondary objective functions. The primary objective function is specified as follows:

$$\text{Maximize} \quad \sum_{i \in I} c_i \cdot \mathcal{T}(g_i) - \sum_{j \in O} d_j \cdot \mathcal{T}(g_j) \quad (1)$$

This part of the objective function serves two purposes. It implicitly satisfies the condition C0. Also, it can be shown that maximization returns as many flip-flops as possible to the environment. The secondary objective function minimizes the total number of flip-flops in the transformed circuit. This is required to ensure that the number of flip-flops in the transformed circuit is not arbitrarily large.

Test sequences obtained for the STAGS model can always be inverse mapped to serve as test sequences for the original high-performance design. To prove this, we will require the following notation. Here, C is the original circuit, and $C_{\mathcal{T}}$ is the corresponding STAGS model obtained using a STAGS transformation $\mathcal{T}$. We introduce two additional circuits $C_{\mathcal{R}}$ and $C_{\mathcal{S}}$.

The circuit $C_{\mathcal{R}}$ is constructed from the STAGS model $C_{\mathcal{T}}$ as follows. Given the STAGS model $C_{\mathcal{T}}$ one can determine the primary inputs and primary outputs that have returned flip-flops to the environment. The graph vertices corresponding to these primary inputs (primary outputs) are assigned positive (negative) values by the transformation $\mathcal{T}$. Let $g_i$ and $g_j$ be one such primary input and primary output, respectively. If primary input $g_i$ returns k flip-flops to the environment, then we add k flip-flops to the primary input $g_i$ in $C\mathcal{T}$. Adding k flip-flops to a signal will delay the signal by k time units. Similarly, if primary output $g_j$ returns k flip-flops to the environment, then we add k flip-flops to the primary output $g_j$ in $C\mathcal{T}$. The resulting circuit is referred to as $C_{\mathcal{R}}$.

The circuit $C_{\mathcal{B}}$ is constructed from the original design C, as follows. Given the STAGS model $C\mathcal{T}$, one can determine the primary inputs and primary outputs that have borrowed flip-flops from the environment. The graph vertices corresponding to these primary inputs (primary outputs) are assigned negative (positive) values by the transformation $\mathcal{T}$. Let $g_i$ and $g_j$ be one such primary input and primary output, respectively. If primary input $g_i$ borrowed k flip-flops from the environment, then we add k flip-flops to the primary input $g_i$ in C. Similarly, if primary output $g_j$ borrowed k flip-flops from the environment, then we add k flip-flops to the primary output $g_j$ in C. The resulting circuit is referred to as $C_{\mathcal{B}}$ Given a circuit C, let I and O be the set of primary inputs and primary outputs, respectively, of circuit C. The ith primary input (primary output) is represented as $g_i$ ($z_i$). Let $S_C$ be a test sequence for the circuit C. The vectors in this sequence are represented as $V_1 \ldots V_{l_c}$. Here, $l_c$ is the length of this test sequence. This test sequence can be viewed as a matrix M that has as many rows as there are vectors and as many columns as there are primary inputs in circuit C. The entry in the rth row and cth column, represented as $M(r, c)$, is the value of the primary input signal $g_c$ in the vector $V_r$. The following two Lemmas will be used in proving the main theorem (Theorem 1).

Lemma 1: A test sequence for circuit $C\mathcal{T}$ can always be mapped to serve as a test sequence for circuit $C_{\mathcal{R}}$.

Proof: Let the test sequence for circuit $C\mathcal{T}$ be $S_C\mathcal{T}$. We will construct the sequence $S_{C\mathcal{R}}$ for circuit $C_{\mathcal{R}}$.

The constructive proof is based on two key observations:

1. Consider a primary input $g_i$ where k flip-flops were added to obtain circuit $C_{\mathcal{R}}$. The addition of k flip-flops delays the series of values applied at $g_i$ by k time units. Therefore, the values applied at primary input $g_i$ for circuit $C\mathcal{T}$, should be advanced by k time units to obtain the series of values to be applied at $g_i$ in circuit $C_{\mathcal{R}}$.

2. Consider a primary output $z_i$ where k flip-flops were added to obtain circuit $C_{\mathcal{R}}$. The addition of k flip-flops delays the observation of values at $z_i$ by k time units. Therefore, values observed in circuit $C\mathcal{T}$ at primary output $z_i$ are observable k time units later (delayed by k time units) in circuit $C_{\mathcal{R}}$.

Different primary inputs (primary outputs) may have to be advanced (delayed) by different time units. If $I_r$ (>0) is the maximum number of time units that any primary input is advanced, then the test sequence $S_{C\mathcal{R}}$ will have $l_{C\mathcal{T}}+I_r$ vectors. The matrix $M_{C\mathcal{R}}$ for the sequence $S_{C\mathcal{R}}$ can be constructed as follows. The element $M_{C\mathcal{R}}(r, c)$ is obtained using the following mapping:

$$M_{C\mathcal{R}}(r,c) = M_C\mathcal{T}(r - \mathcal{T}(g_c), c) \quad : 0 < r - \mathcal{T}(g_c) \leq l_C\mathcal{T}$$
$$= X \quad : \text{Otherwise.}$$

Lemma 2: A test sequence for circuit $C_{\mathcal{B}}$ can always be mapped to serve as a test sequence for circuit C.

Proof: Let the test sequence for circuit $C_{\mathcal{B}}$ be $S_{C\mathcal{B}}$. We will construct the sequence $S_C$ for circuit C. Again, the constructive proof is based on two key observations:

1. Consider a primary input $g_i$ where k flip-flops were added to obtain circuit $C_{\mathcal{B}}$ from circuit C. The addition of k flip-flops delays the series of values applied at $g_i$ by k time units. Therefore, the values applied at primary input $g_i$ for circuit $C_{\mathcal{B}}$, should be delayed by k time units to obtain the series of values to be applied at $g_i$ in circuit C.

2. Consider a primary output $z_i$ where k flip-flops were added to obtain circuit $C_{\mathcal{B}}$. The addition of k flip-flops delays the observation of values at $z_i$ by k time units. Therefore, values observed in circuit $C_{\mathcal{B}}$ at primary output $z_i$ are observable k time units earlier (advanced) in circuit C.

Different primary inputs (primary outputs) may have to be delayed (advanced) by different time units. If $I_b$ (>0) is the maximum number of time units that any primary input is delayed, then the test sequence $S_C$ will have $l_{C\mathcal{B}}+I_b$ vectors. The matrix $M_C$ for the sequence $S_C$ can be constructed as follows. The element $M_C(r, c)$ is obtained using the following mapping:

$$M_C(r,c) = M_{C\mathcal{B}}(r - I_b + \mathcal{T}(g_c), c) \quad : 0 < r - I_b + \mathcal{T}(g_c) \leq l_{C\mathcal{B}}$$
$$= X \quad : \text{Otherwise.}$$

Theorem 1: If $C\mathcal{T}$ is a STAGS transformation of circuit C, then test sequences for $C\mathcal{T}$ can always be inverse mapped to obtain test sequences for circuit C.

Proof: Let the test sequence for circuit $C\mathcal{T}$ be $S_C\mathcal{T}$. We will construct the corresponding sequence $S_C$ for circuit C. The constructive proof consists of the following three steps:

1. Map the test sequence $S_C\mathcal{T}$ to the test sequence $S_C\mathcal{R}$ for the circuit $C_{\mathcal{R}}$.

2. Prove that $C_{\mathcal{R}}$ and $C_{\mathcal{B}}$ are functionally equivalent. Therefore, test sequences for $C_{\mathcal{R}}$ are also test sequences for $C_{\mathcal{B}}$. So $S_{C\mathcal{B}}=S_{C\mathcal{R}}$.

3. Map the test sequence $S_{C\mathcal{B}}$ to the test sequence $S_C$ for the circuit C.

Steps 1 and 3 follow directly from Lemma 1 and Lemma 2 respectively. For Step 2, we derive a STAGS transformation $\mathcal{F}$ that transforms circuit $C_{\mathcal{B}}$ to the circuit $C_{\mathcal{R}}$. Let $G_{\mathcal{B}}$ be the circuit graph of the circuit $C_{\mathcal{B}}$ and $G_{\mathcal{R}}$ be the circuit graph of the circuit $C_{\mathcal{R}}$. The transformation $\mathcal{F}$ is specified as follows:

1. If vertex $g_i$ is a primary input or primary output, assign the value 0.

2. For all other vertices $g_j$ in $G_{\mathcal{B}}$, assign the value $\mathcal{T}(g_j)$.

The transformed arc weights of the graph $G_{\mathcal{B}}$ under the transformation $\mathcal{F}$ is equal to the arc weights of the graph $G_{\mathcal{R}}$. To see this, consider an arc $e=g_i \rightarrow g_j$ of the graph $G_{\mathcal{B}}$. If $g_i$ is not a primary input and $g_j$ is not a primary output then the transformed weight of this arc is given by $$w\mathcal{F}(e) = w\mathbf{s}(e) + \mathcal{F}(g_j) - \mathcal{F}(g_i)$$
$$= w(e) + \mathcal{T}(g_j) - \mathcal{T}(g_i)$$
$$= w\mathcal{T}(e)$$

The weight of the corresponding arc in the graph $G_\mathcal{R}$ is also $w\mathcal{T}(e)$. Next if $g_i$ is a primary input, then $$w\mathcal{F}(e) = w\mathbf{s}(e) + \mathcal{F}(g_j) \quad \text{since} \quad \mathcal{F}(g_i) = 0$$
$$= w(e) - \mathcal{T}(g_i) + \mathcal{T}(g_j) \quad : \mathcal{T}(g_i) < 0$$
$$\phantom{=} w(e) + \mathcal{T}(g_j) \quad : \mathcal{T}(g_i) \geq 0$$
$$= w\mathcal{T}(e) \quad : \mathcal{T}(g_i) < 0$$
$$\phantom{=} w\mathcal{T}(e) + \mathcal{T}(g_i) \quad : \mathcal{T}(g_i) \geq 0$$

The weight of the corresponding arc in the graph $G_\mathcal{R}$ is also $w\mathcal{T}(e)$ if $\mathcal{T}(g_i)<0$ and $w\mathcal{T}(e)+\mathcal{T}(g_i)$ if $\mathcal{T}(g_i)\geq 0$. If $\mathcal{T}(g_i)<0$ then flip-flops were borrowed at the primary input $g_i$ in the transformation $\mathcal{T}$. Then the weight of this arc in the graph $G_\mathcal{R}$ is $w\mathcal{T}(e)$. However, if flip-flops were returned at $g_i$ in the transformation $\mathcal{T}$ then the weight of this arc in $G_\mathcal{R}$ is $w\mathcal{T}(e)+\mathcal{T}(g_i)$. This is because the flip-flops returned have been added to the arc while constructing $C_\mathcal{R}$. The argument for the case when $g_j$ is a primary output is similar to this.

Since the primary inputs and primary outputs have been assigned the value 0 the transformation $\mathcal{F}$ is a retiming transformation. Recent work has shown that retiming preserves testability. Therefore, test sequences for $C_\mathcal{R}$ will serve as test sequences for $C_\mathbf{s}$.

Hence, test sequences for C can always be obtained from test sequences for $C\mathcal{T}$.

Given the matrix $M_C\mathcal{T}$ that corresponds to a test sequence for the STAGS model, the following algorithm derives the test sequence for the original design:

1. Compute $I_r$, the maximum $\mathcal{T}$ value assigned by the STAGS transformation.
2. Compute $I_b$, the minimum $\mathcal{T}$ value assigned by the STAGS transformation.
3. Compute $l_C$, test sequence length for the original circuit. The test sequence length $l_C = l_C \mathcal{T} + I_r - I_b$.
4. Compute the entry in row r and column c of matrix $M_C$ as follows:

$$M_C(r,c) = M_C\mathcal{T}(r - l_f + \mathcal{T}(g_c), c) \quad : 0 < r - l_f + \mathcal{T}(g_c) \leq l_C\mathcal{T}$$
$$= X \quad : \text{Otherwise.}$$

Consider again the STAGS model shown in FIG. 3. A test sequence for the fault G8→G11 s-a-0 computed using the STAGS model is given below.

| Vector | G1 | G2 | G3 |
|---|---|---|---|
| 1 | 1 | x | x |
| 2 | 1 | 1 | 1 |
| 3 | 1 | 0 | x |

From the earlier discussion, the minimum $\mathcal{T}$ value assigned to a primary input is $I_b=0$. Similarly, the maximum $\mathcal{T}$ value assigned to a primary input is $I_r=1$. The length of the test sequence for the original circuit C is given by $l_C=3+1-0=4$. The entry in row r and column c of matrix $M_C$ is obtained as follows:

$$M_C(r,c) = M_C\mathcal{T}(r-1+\mathcal{T}(g_c), c) \quad : 0 < r-1+\mathcal{T}(g_c) \leq l_C\mathcal{T}$$
$$= X \quad : \text{Otherwise.}$$

For example, the entry $M_C(4, 2) = M_C\mathcal{T}(4-1+0, 2)$ since $0 < 4-1+0 \leq 3$. Here, $\mathcal{T}(G2)=0$, $l_f=1$ and $l_C\mathcal{T}=3$. Other entries in the test sequence for C can be derived similarly. The complete test sequence for C is shown below.

| Vector | G1 | G2 | G3 |
|---|---|---|---|
| 1 | 1 | x | x |
| 2 | 1 | x | x |
| 3 | 1 | 1 | 1 |
| 4 | x | 0 | x |

Figure 7:
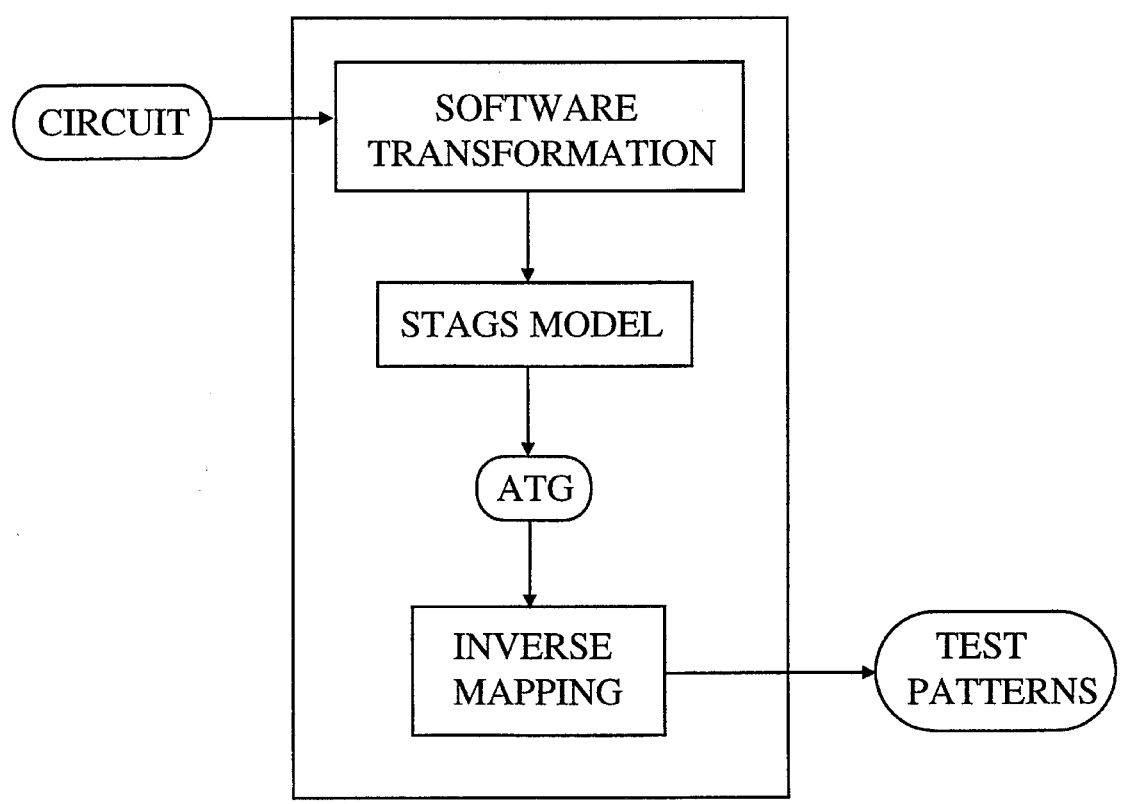
FIG. 7 is a flow chart of the basic steps of the process of the invention.

The STAGS algorithm flow is shown in FIG. 7. The STAGS methodology consists of the following steps:

1. Given a high-performance design, perform STAGS I and/or STAGS II transformations and obtain the STAGS model.
2. Use a conventional sequential automatic test generator (ATG) to derive tests for the STAGS model.
3. Inverse map test sequences for the STAGS model to obtain the test sequences for the original design.

What is claimed is:

1. A process for generating a test set for a sequential integrated circuit comprising the steps of:
    performing a STAGS transformation on a software model of the sequential integrated circuit for providing a modified software model that should be more easily tested, but that need not be functionally equivalent;
    deriving test sequences for the modified software model; and
    inverse mapping the derived test sequences to the original software model for deriving a test set for the original sequential circuit.

2. The process of claim 1 in which the STAGS transformation involves reducing the number of registers.

3. The process of claim 1 in which the STAGS transformation involves reducing the length of test sequences.

4. The process of claim 1 in which the STAGS transformation involves both reducing the number of registers and reducing the length of test sequences.

5. The process of claim 2 in which the STAGS transformation involves borrowing and/or returning registers at the primary inputs and/or primary outputs and positioning them as needed to reduce the number of registers in the modified model.

6. The process of claim 1 in which the inverse mapping step involves transforming the derived test sequences into a test set for the original sequential circuit based on compensating for the registers that were borrowed/returned to the environment in the STAGS translation.

* * * * *